United States Patent
Na et al.

(10) Patent No.: US 10,379,442 B2
(45) Date of Patent: Aug. 13, 2019

(54) METHOD OF MANUFACTURING GRAPHENE FILM AND GRAPHENE FILM MANUFACTURED THEREBY

(71) Applicant: HANWHA AEROSPACE CO.,LTD., Changwon-si (KR)

(72) Inventors: Duck-Hwa Na, Changwon (KR); Eun-Kyu Lee, Changwon (KR); Jong-Hyuk Yoon, Changwon (KR)

(73) Assignee: HANWHA AEROSPACE CO., LTD., Changwon-si (KR)

( * ) Notice: Subject to any disclaimer, the term of this patent is extended or adjusted under 35 U.S.C. 154(b) by 740 days.

(21) Appl. No.: 14/762,575

(22) PCT Filed: Apr. 26, 2013

(86) PCT No.: PCT/KR2013/003615
§ 371 (c)(1),
(2) Date: Jul. 22, 2015

(87) PCT Pub. No.: WO2014/126298
PCT Pub. Date: Aug. 21, 2014

(65) Prior Publication Data
US 2015/0368112 A1    Dec. 24, 2015

(30) Foreign Application Priority Data
Feb. 13, 2013   (KR) ........................ 10-2013-0015538

(51) Int. Cl.
*G03F 7/20* (2006.01)
*C25F 5/00* (2006.01)
(Continued)

(52) U.S. Cl.
CPC .............. *G03F 7/20* (2013.01); *C01B 32/186* (2017.08); *C01B 32/194* (2017.08); *C25F 5/00* (2013.01); *Y10T 156/10* (2015.01); *Y10T 428/30* (2015.01)

(58) Field of Classification Search
CPC ........ Y10T 428/30; B82Y 30/00; C01B 31/00
(Continued)

(56) References Cited

U.S. PATENT DOCUMENTS

2009/0017271 A1* 1/2009 Meiring ................... G06K 7/14
428/195.1
2010/0021708 A1    1/2010 Kong et al.
(Continued)

FOREIGN PATENT DOCUMENTS

KR       10-0819797 B1    4/2008
KR    10-2011-0090398 A    8/2011
(Continued)

OTHER PUBLICATIONS

Wang, Y. et al., "Electrochemical delamination of CVD-grown graphene film: toward the recyclable use of copper catalyst", ACS Nano, Oct. 30, 2011, vol. 5, No. 12, pp. 9927-9933.
(Continued)

*Primary Examiner* — Daniel H Miller
(74) *Attorney, Agent, or Firm* — Sughrue Mion, PLLC (57) ABSTRACT

According to an aspect of the present invention, there is provided a method of manufacturing a graphene film, the method including: preparing a catalyst metal having at least a surface on which graphene is formed; forming a support layer on the graphene; and isolating the graphene and the support layer from the catalyst metal by dipping the catalyst metal in an electrolytic solution perpendicularly to a liquid surface of the electrolytic solution when a voltage is applied to the catalyst metal.

18 Claims, 4 Drawing Sheets

(51) Int. Cl.
*C01B 32/186* (2017.01)
*C01B 32/194* (2017.01)

(58) Field of Classification Search
USPC .......................................... 428/408; 423/448
See application file for complete search history.

(56) References Cited

U.S. PATENT DOCUMENTS

| | | | |
|---|---|---|---|
| 2011/0030879 A1 | 2/2011 | Veerasamy | |
| 2011/0048625 A1* | 3/2011 | Caldwell | B82Y 30/00 156/233 |
| 2011/0108521 A1 | 5/2011 | Woo et al. | |
| 2013/0319973 A1* | 12/2013 | Tour | C01B 31/0484 216/54 |

FOREIGN PATENT DOCUMENTS

| | | |
|---|---|---|
| KR | 10-2012-0103987 A | 9/2012 |
| WO | 2012/020950 A2 | 2/2012 |
| WO | 2012/021677 A2 | 2/2012 |
| WO | 2012/134205 A1 | 10/2012 |
| WO | 2012134205 A1 | 10/2012 |

OTHER PUBLICATIONS

International Search Report for PCT/KR2013/003615 dated Sep. 30, 2013 [PCT/ISA/210].

Written Opinion for PCT/KR2013/003615 dated Sep. 30, 2013 [PCT/ISA/237].

Communication dated Jun. 17, 2016, issued by the State Intellectual Property Office of P.R. China in counterpart Chinese Application No. 201380070317.6.

Wang et al: "Electrochemical Delamination of CVD-Grown Graphene Film: Toward the Recyclable Use of Copper Catalyst" ACSNANO, vol. 5, No. 12, pp. 9927-9933 (7 pages total).

Communication dated Feb. 13, 2019, issued by the Korean Intellectual Property Office in corresponding Korean Application No. 10-2013-0069204.

* cited by examiner

METHOD OF MANUFACTURING GRAPHENE FILM AND GRAPHENE FILM MANUFACTURED THEREBY

TECHNICAL FIELD

The present invention relates to a method of manufacturing a graphene film and a graphene film formed by the method.

BACKGROUND ART

Graphene has a structure in which carbons are connected to each other in a hexagonal shape to form a transparent two-dimensional plane structure having a honeycomb shape, and has a small thickness and a very large electric conductivity. By using the characteristics of graphene, it has been tried to apply graphene to touch panels, transparent displays, or flexible displays. As interest in graphene increases, a method of mass producing graphene of high quality is necessary.

DISCLOSURE OF INVENTION

Technical Problem

Graphene film may be obtained through the following processes: First, graphene is formed on at least a surface of a catalyst metal, a support structure is formed on the graphene, and then, the catalyst metal is removed and the graphene is transferred onto a target film to thereby obtain a graphene film on which the graphene is formed. However, when removing the catalyst metal, the graphene may be damaged, thereby degrading electric and optical characteristics of the grapheme film. Moreover, since the graphene film becomes large, it is difficult to remove the catalyst metal evenly, and thus, it takes a long time to remove the catalyst metal.

Solution to Problem

According to an aspect of the present invention, there is provided a method of manufacturing a graphene film, which has simple manufacturing processes with a short manufacturing time, and a graphene film manufactured by the method.

According to an aspect of the present invention, there is provided a method of manufacturing a graphene film, the method including: preparing a catalyst metal having at least a surface on which graphene is formed; forming a support layer on the graphene; and isolating the graphene and the support layer from the catalyst metal by dipping the catalyst metal in an electrolytic solution perpendicularly to a liquid surface of the electrolytic solution when a voltage is applied to the catalyst metal. The electrolytic solution may contain sodium or a hydroxyl group (—OH).

The electrolytic solution may include at least one of sodium hydroxide (NaOH), sodium carbonate ($Na_2CO_3$), sodium phosphate ($Na_3PO_4$), sodium silicate ($Na_2SiO_3$), potassium hydroxide (KOH), calcium hydroxide ($Ca(OH)_2$), barium hydroxide ($Ba(OH)_2$), and magnesium hydroxide ($Mg(OH)_2$).

The electrolytic solution may further include a surfactant.

The forming of the support layer may be performed by coating the graphene with a support layer forming material in a liquid phase.

The support layer forming material may include at least one of polycarbonate (PC), polyimide (PI), polyvinylidene fluoride (PVDF), and polyethylene terephthalate (PET).

The support layer forming material may include a photosensitive material.

The method may further include: forming a target film on the graphene; forming a pattern on the support layer by exposing and developing the support layer by using a pattern mask; patterning the graphene to correspond to the pattern formed on the support layer; and removing the support layer, after the isolating of the graphene and the support layer.

The forming of the support layer may be performed by attaching a tape to the graphene.

The tape may be one of an adhesive tape, a thermal release tape, and a heat sensitive tape.

When the catalyst metal is dipped in the electrolytic solution perpendicularly to the liquid surface of the electrolytic solution, the graphene and the support layer may be isolated at the liquid surface and float on the liquid surface.

The method may further include: collecting and drying the floating graphene and the support layer; and forming a target film on the support layer.

The method may further include: collecting the floating graphene and the support layer, and cleaning and drying the graphene and the support layer; and doping the graphene.

According to another aspect of the present invention, there is provided a graphene film manufactured by a method including: forming a graphene film comprising graphene and a support layer on at least one surface of a catalyst metal; and isolating the graphene film from the catalyst metal by dipping the catalyst metal in an electrolytic solution perpendicularly to a liquid surface of the electrolytic solution when a voltage is applied to the catalyst metal.

The support layer forming material may include at least one of polycarbonate (PC), polyimide (PI), polyvinylidene fluoride (PVDF), and polyethylene terephthalate (PET).

The graphene film may further include a target film formed on the support layer.

The graphene may further include a doping material, and the graphene film may further include a cover film formed on the graphene.

The electrolytic solution may contain sodium or a hydroxyl group (—OH).

The electrolytic solution may include at least one of sodium hydroxide (NaOH), sodium carbonate ($Na_2CO_3$), sodium phosphate ($Na_3PO_4$), sodium silicate ($Na_2SiO_3$), potassium hydroxide (KOH), calcium hydroxide ($Ca(OH)_2$), barium hydroxide ($Ba(OH)_2$), and magnesium hydroxide ($Mg(OH)_2$).

The electrolytic solution may further include a surfactant.

Advantageous Effects of Invention

According to an aspect of the present invention, there is provided a method of manufacturing a graphene film, by which manufacturing processes are simplified and a manufacturing time is reduced. A graphene film yield may be improved to be higher than a manufacturing method in which a catalyst metal is etched.

BEST MODE FOR CARRYING OUT THE INVENTION

According to an aspect of the present invention, there is provided a method of manufacturing a graphene film, the method including: preparing a catalyst metal having at least a surface on which graphene is formed; forming a support layer on the graphene; and isolating the graphene and the support layer from the catalyst metal by dipping the catalyst metal in an electrolytic solution perpendicularly to a liquid surface of the electrolytic solution when a voltage is applied to the catalyst metal.

MODE FOR THE INVENTION

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

While such terms as first, second, etc., may be used to describe various components, such components must not be limited to the above terms. The above terms are used only to distinguish one component from another.

It will be understood that when an element or layer is referred to as being "on another element or layer, the element or layer can be directly on another element or layer or intervening elements or layers.

Embodiments of the invention will be described below in more detail with reference to the accompanying drawings. Those components that are the same or are in correspondence are rendered the same reference numeral regardless of the figure number, and redundant explanations are omitted. In the drawings, the thicknesses of layers and regions are exaggerated for clarity.

Figure 1:
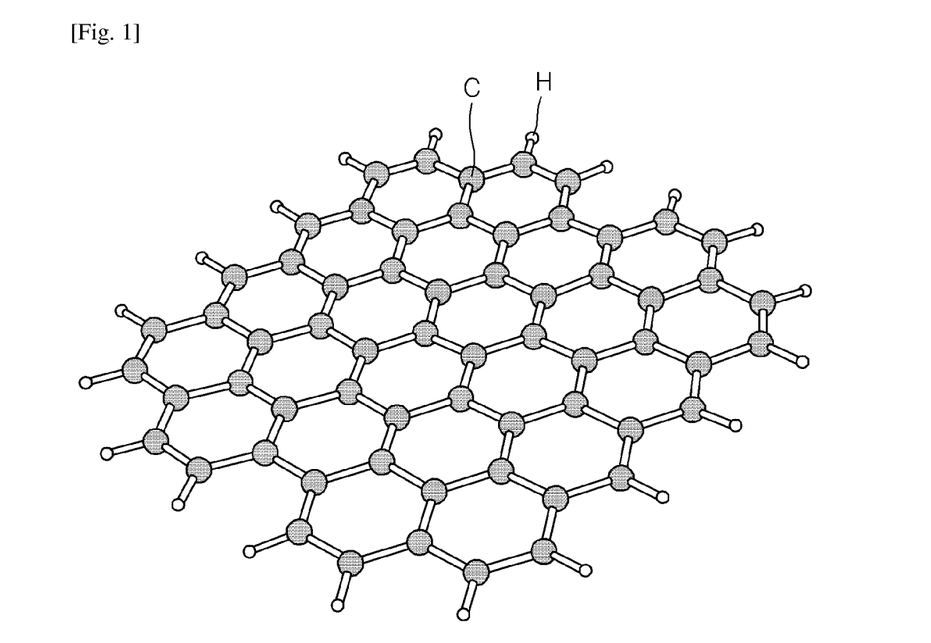
FIG. 1 is a perspective view of graphene.

FIG. 1 is a schematic perspective view of graphene used in the present invention.

The term graphene used in the present specification denotes layer or sheet-shaped graphene in which a plurality of carbon atoms are joined together via a multiple covalent bond to form a polycyclic aromatic molecule, and the carbon atoms joined together via a multiple covalent bond have a six-membered ring as a fundamental repeat unit and may further include a five-membered ring and/or a seven-membered ring. Therefore, the graphene layer looks like a monolayer of carbon atoms forming covalent bonds (typically, sp2 bond). The graphene layer may have various structures depending on a five-membered ring content and/or a seven-membered ring content of graphene.

As described above, the graphene layer may be formed of a monolayer of carbon atoms and may be formed of multiple stacked layers thereof. Typically, a side end of the graphene may be saturated with hydrogen atoms.

Also, the term graphene film used in the present specification may denote a stacked body, in which a substrate or a film supporting the graphene is further formed under the graphene shown in FIG. 1. In the present specification, the graphene film may be classified with numbers such as first, second, third, and fourth according to structures and stacked types thereof.

The term stacked body used in the present specification may denote a plurality of layers including graphene. According to a method of manufacturing a graphene film of the present invention, the stacked body may include at least one layer from among catalyst metal, a support layer, a target film, a protective film, and a tape, in addition to the graphene.

Hereinafter, a method of manufacturing a graphene film, according to an embodiment of the present invention, will be described below with reference to FIGS. 2 through 10. FIGS. 2 through 10 are side sectional views illustrating the method of manufacturing a graphene film, according to an embodiment of the present invention.

Figure 2:
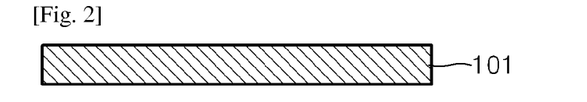
FIGS. 2 through 10 are side sectional views illustrating a method of manufacturing a graphene film, according to an embodiment of the present invention.

Referring to FIG. 2, a catalyst metal 101 is pre-processed.

The catalyst metal 101 serves as a catalyst for growing graphene, and may be formed as a discontinuous panel type or a continuous roll type. The catalyst metal 101 may contain one or more metals or alloys selected from the group consisting of copper (Cu), nickel (Ni), cobalt (Co), iron (Fe), platinum (Pt), gold (Au), silver (Ag), aluminium (Al), chrome (Cr), magnesium (Mg), manganese (Mn), molybdenum (Mo), rhodium (Rh), silicon (Si), tantalum (Ta), titanium (Ti), tungsten (W), uranium (U), vanadium (V), palladium (Pd), Yttrium (Y), zirconium (Zr), germanium (Ge), brass, bronze, white brass, and stainless steel; however, the present invention is not limited thereto.

The catalyst metal 101 may be a single layer, or may be formed as a layer in a multi-layered substrate including at least two layers. In latter case, the catalyst metal 101 layer is disposed at an outermost layer of the multi-layered substrate.

Before forming the graphene, a pre-process for cleaning a surface of the catalyst metal 101 is performed. The pre-process is performed to remove impurities existing on the surface of the catalyst metal 101 and may be performed by using hydrogen gas. Also, the surface of the catalyst metal 101 is cleaned by using an acid solution or an alkali solution to reduce defects occurring in a graphene forming process. The process for cleaning the surface of the catalyst metal 101 may be omitted if necessary.

Figure 3:
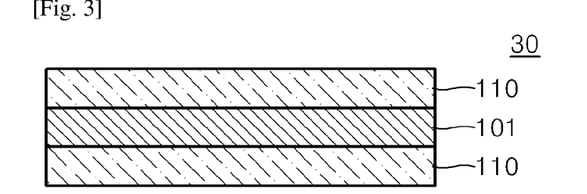

Next, referring to FIG. 3, a process for forming graphene 110 is performed.

When the catalyst metal 101 is carried into a chamber, a carbon supply source in a gas phase is injected in the chamber and a thermal treatment is performed. The thermal treatment includes heating and cooling processes. The graphene 110 may be formed by various methods, for example, chemical vapor deposition (CVD), thermal CVD (TCVD), rapid TVCD (RTCVD), inductive coupled plasma chemical vapor deposition (ICP-CVD), and atomic layer deposition (ALD).

The carbon supply source in a gas phase may be one or more selected from the group consisting of carbon atoms such as methane ($CH_4$), carbon monoxide (CO), ethane ($C_2H_6$), ethylene ($CH_2$), ethanol ($C_2H_5$), acetylene ($C_2H_2$), propane ($CH_3CH_2CH_3$), propylene ($C_3H_6$), butane ($C_4H_{10}$), pentane ($CH_3(CH_2)_3CH_3$), pentene ($C_5H_{10}$), cyclopentadiene ($C_5H_6$), hexane ($C_6H_{14}$), cyclohexane ($C_6H_{12}$), benzene ($C_6H_6$), and toluene ($C_7H_8$).

The carbon supply source in a gas phase is separated into carbon atoms and hydrogen atoms at a high temperature. The separated carbon atoms are deposited on the heated catalyst metal 101, and then, the graphene 110 is grown while cooling down the catalyst metal 101.

The graphene 110 may be formed on at least a surface of the catalyst metal 101. As shown in a stacked body 30 of FIG. 3, the graphene 110 may be formed on opposite surfaces of the catalyst metal 101; however, the present invention is not limited thereto, that is, the graphene 110 may be formed on only one surface of the catalyst metal 101.

Figure 4:
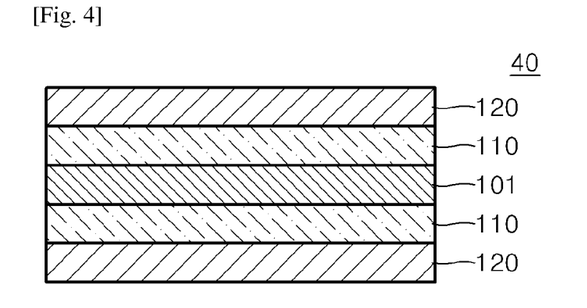

Next, referring to FIG. 4, a support layer 120 is formed on the graphene 110.

The support layer 120 supports the graphene 110 so that a shape of the graphene 110 is maintained and damage to the graphene 110 from is prevented. The support layer 120 may be formed by coating the graphene 110 with a support layer forming material in a liquid phase and hardening the support layer forming material. The support layer forming material may be coated on the graphene 110 by using at least one of a dip coating method, a spin coating method, a bar coating method, a gravure coating method, and a roll coating method.

The support layer forming material may include at least one of polycarbonate (PC), polyimide (PI), polyvinylidene fluoride (PVDF), and polyethylene terephthalate (PET). Since the support layer 120 formed of the support layer forming material serves as a target film, a process of removing the support layer 120 and a process of transferring a target film may be omitted. Also, if the support layer 120 is formed by using the support layer forming material in a liquid phase, a support layer that is relatively thinner than an attached target film, and thus, a thin graphene film may be manufactured.

The support layer 120 may have a thickness of about a few micrometre to tens of micrometre. For example, the support layer 120 may have a thickness of about 1 micrometre to about 60 micrometre. If the support layer 120 has a thickness less than 1 micrometre, the support layer 120 easily breaks so as not to support the graphene 110. If the support layer 120 has a thickness greater than 60 micrometre, the graphene 110 and the support layer 120 may not be easily separated from the catalyst metal 101 by using an electrochemical delamination process.

As shown in a stacked body 40 of FIG. 4, the support layer 120 is formed on both the graphene 110 formed on opposite surfaces of the catalyst metal 101. According to the present embodiment, the catalyst metal 101 is not removed by using a wet etching process, the graphene 110 formed on the opposite surfaces of the catalyst metal 101 may be acquired. Therefore, a graphene film yield may be about twice higher than that of the process in which the catalyst metal 101 is removed by a wet etching process.

Figure 5:
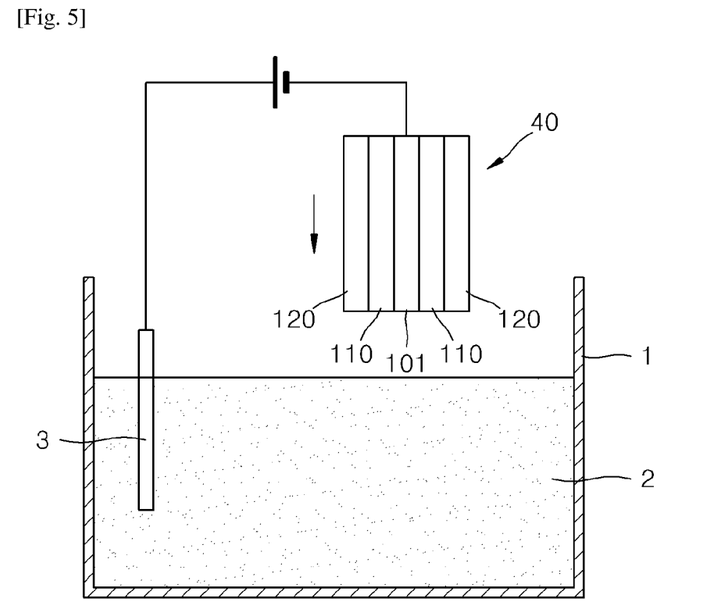
Figure 6:
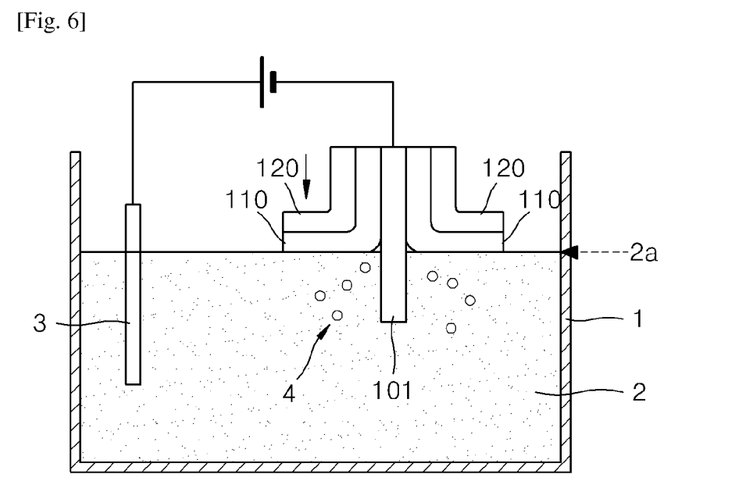
Figure 7:
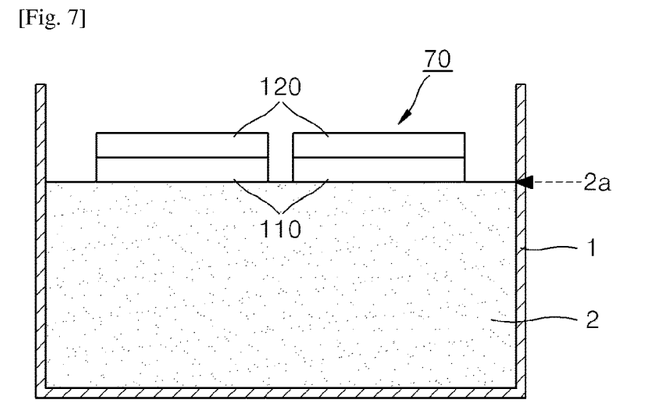

Referring to FIGS. 5 through 7, the graphene 110 and the support layer 120 are isolated from the catalyst metal 101 by using an electrochemical delamination process.

Referring to FIG. 5, an electrolytic solution 2 is prepared in a water tank 1. The electrolytic solution 2 or electrolyte aqueous solution is dissociated into ions in a solution such as water to conduct electric current. According to the embodiment of the present invention, the electrolytic solution 2 may contain sodium (Na) or a hydroxyl group (—OH). For example, the electrolytic solution 2 may be an aqueous solution containing at least one of sodium hydroxide (NaOH), sodium carbonate ($Na_2CO_3$), sodium phosphate ($Na_3PO_4$), sodium silicate ($Na_2SiO_3$), potassium hydroxide (KOH), calcium hydroxide ($Ca(OH)_2$), barium hydroxide ($Ba(OH)_2$), and magnesium hydroxide ($Mg(OH)_2$). In an electrochemical delamination process, the electrolytic solution 2 is an important factor in determining a delamination speed. As a comparative example, when a $K_2S_2O_8$ aqueous solution (0.05 mM) is used as an electrolytic solution, it takes about 10 minutes to electrochemically delaminate graphene and a support layer having an area of 10 cm×10 cm from a catalyst metal. However, if an NaOH aqueous solution is used as the electrolytic solution 2 like in the present embodiment, it only takes about 10 seconds to 20 seconds to electrochemically delaminate the graphene 110 and the support layer 120 having an area of 10 cm×10 cm from the catalyst metal 101. In the case of using the electrolytic solution 2 containing sodium, it is determined that the delamination speed in the electrochemical delamination process increases due to composite elements including ionization of sodium and the kind of negative ions.

Referring to FIGS. 5 and 6, a direct current (DC) voltage is applied to the catalyst metal 101 of the stacked body 40 shown in FIG. 4, which corresponds to a cathode, and a glassy carbon 3 corresponding to an anode, and after that, the stacked body 40 of FIG. 4 is dipped in the electrolytic solution 2 perpendicularly to a liquid surface 2a. When dipping the stacked body 40 of FIG. 4 in the electrolytic solution 2 perpendicularly to the liquid surface 2a, the graphene 110 and the support layer 120 are isolated at the liquid surface 2a, and the isolated graphene 110 and the support layer 120 float on the liquid surface 2a. The DC voltage ranges from about 3 V to about 30 V, in which the electrochemical delamination may be performed normally.

When applying the voltage, the water contained in the electrolytic solution 2 is reduced as shown in following chemical formula, and then, hydrogen gas bubbles 4 generate at an interface between the graphene 110 and the catalyst metal 101.

$$2H_2O(1)+2e^- H_2(g)+2OH^-(aq) \qquad (1)$$

Due to the hydrogen gas bubbles 4, the graphene 110 and the support layer 120 are isolated from the catalyst metal 101.

Next, referring to FIG. 7, the graphene 110 and the support layer 120 isolated from the catalyst metal 101 may float on the liquid surface 2a. Owing to less densities and greater surface areas than those of the electrolytic solution 2, the graphene 110 and the support layer 120 may float on the liquid surface 2a.

After collecting the floating the graphene 110 and the support layer 120, a process of cleaning the electrolytic solution 2 remaining on the graphene 110 and the support layer 120 and a process of drying the graphene 110 and the support layer 120 may be further performed.

The stacked body of the graphene 110 and the support layer 120 obtained through the processes shown in FIGS. 5 through 7 may be referred to as a first graphene film 70. The first graphene film 70 may be used as a transparent electrode film of a flexible display, an organic light-emitting device, and a solar battery.

Figure 8:
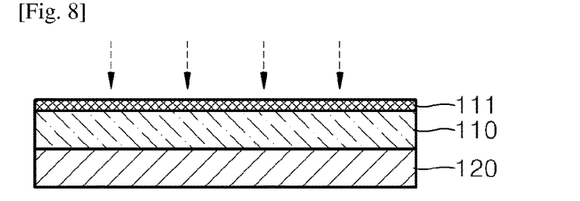

In order to improve electric characteristics of the graphene film and prevent damage to the graphene film, the following processes may be additionally performed:

Referring to FIG. 8, a doping process of the graphene 110 is performed. The doping may be performed in order to improve electric characteristics of the graphene 110 of the first graphene film 70, and a dry doping method or a wet doping method may be used. FIG. 8 shows a doping material layer 111. The above doping process may be omitted if necessary.

Figure 9:
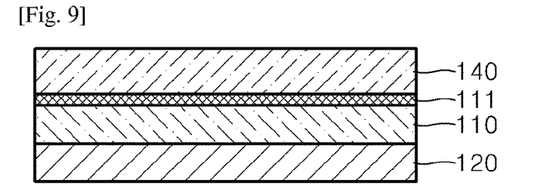

Next, referring to FIG. 9, a cover film 140 is attached onto the graphene 110. The cover film 140 protects the graphene 110 on which the doping material layer 111 is formed, and the process of attaching the cover film 140 may be omitted if necessary.

Figure 10:
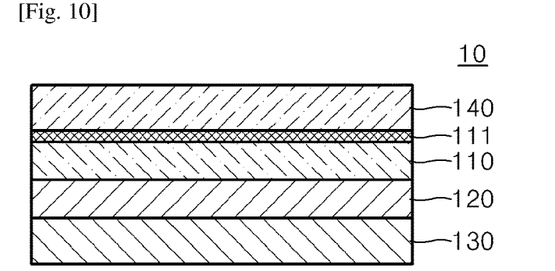

Next, referring to FIG. 10, a target film 130 is attached onto the support layer 120.

The target film 130 may be at least one of PET, polyimide (PI), polydimethylsiloxane (PDMS), plastic, glass, and metal; however, the present invention is not limited thereto.

The process of attaching the target film 130 may be performed when a user requires a thick graphene film, and thus, the process may be omitted if necessary.

The stacked body shown in FIG. 10 may be referred to as a second graphene film 10 that may be used in various fields, like the first graphene film 70 (refer to FIG. 7) described above.

Processes of determining whether there is no damage to the first and second graphene films 70 and 10 and analyzing electric characteristics of the first and second graphene films 70 and 10 may be further performed. The present invention is not limited to the above manufacturing processes of a graphene film, that is, a process order may be changed and some processes may be omitted or added.

FIGS. 8 through 10 show one graphene 110 and the supporting layer 120 acquired in FIG. 7. However, another graphene 110 and the support layer 120 acquired in the process shown in FIG. 7 may be manufactured as a graphene film through the same processes, and according to the embodiments of the present invention, the graphene 110 grown on the opposite surfaces of the catalyst metal 101 may be manufactured as graphene films.

FIGS. 2 through 10 illustrate that the catalyst metal 101, the cover film 140, and the target film 130 used to manufacture the graphene film are discontinuous panel type. However, the present invention is not limited thereto, and the catalyst metal 101, the cover film 140, and the target film 130 used to manufacture the graphene film are roll type that is continuous in a direction.

FIGS. 11 through 14 are side sectional views illustrating a method of manufacturing a graphene film, according to another embodiment of the present invention.

According to the embodiment shown in FIGS. 11 through 14, a material forming a support layer is different from that of the embodiment shown in FIGS. 2 through 10, and a graphene film on which graphene is patterned may be obtained. In the present embodiment, the material forming the support layer is different from that of the previous embodiment, an element corresponding to the support layer 120 of the previous embodiment (FIG. 5) is referred to as a photosensitive support layer 121. Hereinafter, differences from the previous embodiment are described.

The graphene 110 and the photosensitive support layer 121 are acquired through the processes illustrated in FIGS. 2 through 7. Here, the photosensitive support layer 121 may be formed by coating the graphene 110 with a photosensitive support layer forming material of a liquid type containing the photosensitive material and then hardening the photosensitive support layer forming material, or by applying a film containing a photosensitive material on the graphene 110. For example, the photosensitive support layer 121 may be formed by using photoresist (PR), dry film resist (DFR), or photo solder resist (PSR).

The method of forming the photosensitive support layer 121 and the thickness of the photosensitive support layer 121 are similar to those of the support layer 120 (refer to FIG. 5), and thus, detailed descriptions thereof are not provided here.

Figure 11:
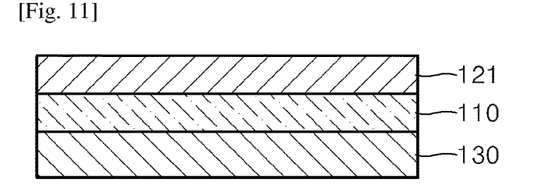
FIGS. 11 through 14 are side sectional views illustrating a method of manufacturing a graphene film, according to another embodiment of the present invention.

Referring to FIG. 11, the target film 130 is formed on the surface of the graphene 110, which is not covered by the photosensitive support layer 121. The kind of the target film 130 and the forming method of the target film 130 are described in the previous embodiment, and thus, detailed descriptions thereof are not provided here.

Figure 12:
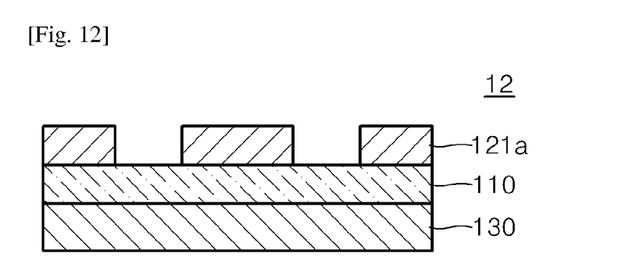

Next, referring to FIG. 12, a photosensitive support layer pattern 121a is formed through exposure and developing processes by using a mask in which a pattern is formed. Since the photosensitive support layer 121 contains the photosensitive material, the patterning may be performed without applying an additional photosensitive material such as PR.

Figure 13:
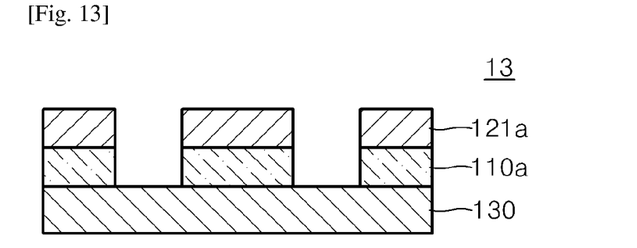

Referring to FIG. 13, a graphene pattern 110a is formed by using the photosensitive support layer pattern 121a as a mask. The graphene 110 may be patterned by a dry etching process using plasma. In more detail, when oxygen plasma ions are applied to a stacked body 12 of FIG. 12, the graphene 110 covered by the photosensitive support layer pattern 121a remains; however, the exposed graphene 110, which is not covered by the photosensitive support layer pattern 121a, is combined with the oxygen plasma ions to be converted to carbon monoxide or carbon dioxide and removed.

Figure 14:
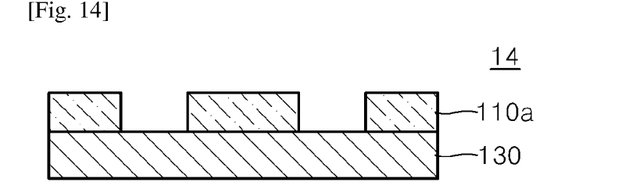

Next, referring to FIG. 14, the photosensitive support layer pattern 121a is removed from a stacked body 13 of FIG. 13 to form a third graphene film 14 including the graphene pattern 110a.

After that, the doping process, the cover film forming process, the additional target film forming process, and the test process may be additionally performed, similarly to the previous embodiment.

Figure 15:
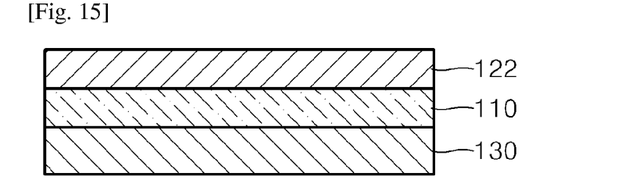
FIGS. 15 and 16 are side sectional views illustrating a method of manufacturing a graphene film, according to another embodiment of the present invention.
Figure 16:
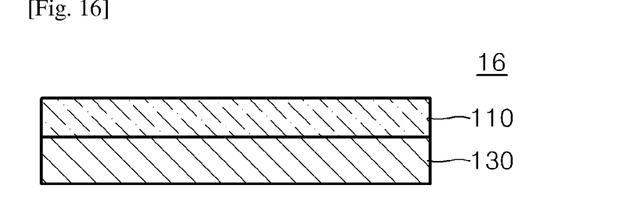

FIGS. 15 and 16 are side sectional views illustrating a method of manufacturing a graphene film, according to another embodiment of the present invention.

According to the embodiment shown in FIGS. 15 and 16, a material forming a support layer is different from those of the previous embodiments. Therefore, an element corresponding to the support layer 120 (refer to FIG. 5) of the previous embodiment is referred to as a tape 122. Hereinafter, differences from the previous embodiments are described.

The graphene 110 and the tape 122 are acquired through the processes illustrated in FIGS. 2 through 7. Here, the tape 122 is a support member including an adhesive layer. The tape 122 may be one of an adhesive tape, a thermal release tape, and a heat sensitive tape according to a kind of the adhesive layer.

The adhesive tape is manufactured by forming the adhesive layer on a support member formed of PET. The adhesive layer may include a material combined to a surface of an adhesive target by a chemical interaction and a mechanical interaction, regardless of temperature. For example, the adhesive layer may include an epoxy-based material, an acryl-based material, or a silicon-based material.

In the case of the thermal release tape, an adhesive layer has an adhesive property under room temperature; however, the adhesive property is lost when the adhesive layer is heated to a certain isolation temperature or higher. On the contrary, in the case of the heat sensitive tape, the adhesive layer includes semi-crystalline graft copolymer, for example, intelimer polymer. The adhesive layer including such a component has a variable adhesive force based on a switching temperature Ts. In more detail, the intelimer polymer is in a crystalline state at a temperature less than the switching temperature Ts, and thus, a volume thereof is reduced to lose the adhesive force. For example, the intelimer polymer may have a small adhesive force of, for example, about 0.001 N/25 mm to about 0.1 N/25 mm. However, the intelimer polymer is in an amorphous state at a temperature higher than the switching temperature Ts, and thus, the volume thereof increases and the adhesive force increases. For example, the intelimer polymer may have a large adhesive force of, for example, about 1N/25 mm to about 10N/25 mm. Therefore, in the case of the heat sensitive tape, the heat sensitive tape is attached to the graphene 110 at a high temperature, and then, is isolated from the graphene 110 at a low temperature.

A thickness of the tape 122 is similar to that of the support layer 120 (refer to FIG. 5) in the previous embodiment, and thus, detailed descriptions thereof are not provided.

Next, referring to FIG. 15, the target film 130 is formed on a surface of the graphene 110, which is not covered by the tape 122. The kind of the target film 130 and the forming method of the target film 130 are described above in the previous embodiment, and thus, descriptions thereof are not provided here.

Next, referring to FIG. 16, the tape 122 is removed to fabricate a fourth graphene film 16 consisting of the graphene 110 and the target film 130.

If the thermal release tape is used, heat at a temperature higher than the isolation temperature is applied to the thermal release tape to weaken the adhesive force of the thermal release tape, and then, the thermal release tape is detached from the graphene 110. If the heat sensitive tape is used, the temperature is reduced less than the switching temperature so as to weaken the adhesive force of the heat sensitive tape, and then, the heat sensitive tape is detached from the graphene 110.

After that, similarly to the previous embodiments, the doping process, the cover film forming process, the additional target film forming process, and the test process may be additionally performed.

While the present invention has been particularly shown and described with reference to exemplary embodiments thereof, it will be understood by those of ordinary skill in the art that various changes in form and details may be made therein without departing from the spirit and scope of the present invention as defined by the following claims.

INDUSTRIAL APPLICABILITY

According to embodiments of the present invention, a method of manufacturing graphene having improved electric characteristics and graphene manufactured by the method may be provided, and thus, graphene having a large area may be commercially used. In addition, embodiments of the present invention may be applied to a transparent electrode including graphene, an active layer, a display device including the transparent electrode and the active layer, an electronic device, an optoelectronic device, a battery, and a solar battery.

The invention claimed is:

1. A method of manufacturing a graphene film, the method comprising:
   preparing a catalyst metal having at least a surface on which graphene is formed;
   forming a support layer on the graphene; and
   isolating the graphene and the support layer from the catalyst metal by dipping a stacked body comprising the catalyst metal, the graphene and the support layer in an electrolytic solution perpendicularly to a liquid surface of the electrolytic solution when a voltage is applied to the catalyst metal of the stacked body,
   wherein the electrolytic solution comprises a surfactant, and
   wherein the forming the support layer is performed by coating the graphene with a support layer forming material in a liquid phase.

2. The method of claim 1, wherein the electrolytic solution contains sodium or a hydroxyl group (—OH).

3. The method of claim 1, wherein the electrolytic solution comprises at least one of sodium hydroxide (NaOH), sodium carbonate ($Na_2CO_3$), sodium phosphate ($Na_3PO_4$), sodium silicate ($Na_2SiO_3$), potassium hydroxide (KOH), calcium hydroxide ($Ca(OH)_2$), barium hydroxide ($Ba(OH)_2$), and magnesium hydroxide ($Mg(OH)_2$).

4. The method of claim 1, wherein the support layer forming material comprises a photosensitive material.

5. The method of claim 4, further comprising:
   forming a target film on the graphene;
   forming a pattern on the support layer by exposing and developing the support layer by using a pattern mask;
   patterning the graphene to correspond to the pattern formed on the support layer; and
   removing the support layer, after the isolating of the graphene and the support layer.

6. The method of claim 1, wherein the forming of the support layer is performed by attaching a tape to the graphene.

7. The method of claim 6, wherein the tape is one of an adhesive tape, a thermal release tape, and a heat sensitive tape.

8. The method of claim 1, wherein when the stacked body is dipped in the electrolytic solution perpendicularly to the liquid surface of the electrolytic solution, the graphene and the support layer are isolated at the liquid surface and float on the liquid surface.

9. The method of claim 8, further comprising:
   collecting and drying the floating graphene and the support layer; and
   forming a target film on the support layer.

10. The method of claim 9, further comprising:
    collecting the floating graphene and the support layer, and cleaning and drying the graphene and the support layer; and
    doping the graphene.

11. The method of claim 1, wherein a thickness of the support layer is about 1 μm to about 60 μm.

12. A graphene film manufactured by a method comprising:
    forming a graphene film comprising graphene and a support layer on at least one surface of a catalyst metal; and
    isolating the graphene film from the catalyst metal by dipping a stacked body comprising the catalyst metal, the graphene and the support layer in an electrolytic solution perpendicularly to a liquid surface of the electrolytic solution when a voltage is applied to the catalyst metal of the stacked body,
    wherein the electrolytic solution comprises a surfactant, and
    wherein the forming the support layer is performed by coating the graphene with a support layer forming material in a liquid phase.

13. The graphene film of claim 12, further comprising a target film formed on the support layer.

14. The graphene film of claim 12, wherein the graphene further comprises a doping material, and the graphene film further comprises a cover film formed on the graphene.

15. The graphene film of claim 12, wherein the electrolytic solution contains sodium or a hydroxyl group (—OH).

16. The graphene film of claim 15, wherein the electrolytic solution comprises at least one of sodium hydroxide (NaOH), sodium carbonate ($Na_2CO_3$), sodium phosphate ($Na_3PO_4$), sodium silicate ($Na_2SiO_3$), potassium hydroxide (KOH), calcium hydroxide ($Ca(OH)_2$), barium hydroxide ($Ba(OH)_2$), and magnesium hydroxide ($Mg(OH)_2$).

17. The graphene film of claim 16, wherein the electrolytic solution further comprises a surfactant.

18. The graphene film of claim 12, wherein a thickness of the support layer is about 1 μm to about 60 μm.

* * * * *